United States Patent [19]
Palm et al.

[11] 4,085,383
[45] Apr. 18, 1978

[54] MATRIX SELECTION AMPLIFIER CIRCUIT FOR LOW IMPEDANCE HEADS IN A MAGNETIC DISC MEMORY DEVICE

[75] Inventors: William A. Palm, Minnetonka; Duane A. Young, Bloomington, both of Minn.

[73] Assignee: Control Data Corporation, Minneapolis, Minn.

[21] Appl. No.: 730,501

[22] Filed: Oct. 7, 1976

[51] Int. Cl.² .............................................. H03F 3/45
[52] U.S. Cl. ..................................... 330/295; 330/51; 330/252
[58] Field of Search .......................... 330/51, 252, 295

[56] References Cited

U.S. PATENT DOCUMENTS

| | | | |
|---|---|---|---|
| 3,316,495 | 4/1967 | Sherer | 330/30 R |
| 3,327,236 | 6/1967 | Krossa et al. | 330/30 R X |
| 3,387,224 | 6/1968 | Fleischer et al. | 330/30 R |

*Primary Examiner*—Lawrence J. Dahl
*Attorney, Agent, or Firm*—William J. McGinnis

[57] ABSTRACT

A transistor amplifier circuit operating in matrix interconnection for selectively amplifying signals received on a magnetic recording media by a low impedance head is disclosed which uses a common base preamplifier circuit for signal selection with a common collector amplifier and a common emitter feed-back network.

3 Claims, 2 Drawing Figures

MATRIX SELECTION AMPLIFIER CIRCUIT FOR LOW IMPEDANCE HEADS IN A MAGNETIC DISC MEMORY DEVICE

BACKGROUND OF THE INVENTION

This invention relates to the means required to derive signals from magnetic recording media. More specifically, in magnetic disc devices where multiple heads are used on a single head arm and where selection of the single magnetic head is necessary to select a single region of the magnetic disc, this invention relates to a matrix amplifier device suitable for use with low impedance heads associated with high frequency recovery of magnetically recorded data.

In particular, one direction of development in the magnetic disc recording art relates to the use of low impedance one turn or a small number of magnetic pick-up and write heads which may be deposited on an appropriate magnetic medium, for example. Such one turn pick-up heads have the low impedance characteristics necessary for high rates of recovery of recorded magnetic data. In the prior art, magnetic heads typically consisted of many turns of a fine wire on an appropriate magnetic core. Such heads, consisting of many turns, have a comparatively higher impedance than a single turn head. Such prior art higher impedance heads were used in situations where multiple heads were associated on a single head arm assembly and a particular head of several was selected through use of a diode matrix arrangement to select a given region of the magnetic disc from which it was desired to recover data or write data. However, diodes have a comparatively high impedance and were suitable only for the several turn heads which also had a comparatively higher impedance. Diodes having a comparatively high impedance do not work effectively in a matrix selection arrangement with low impedance, one turn heads where the head impedance is considerably smaller than the impedance of the diode selection matrix.

Therefore, development of the high frequency one turn head is dependent upon the development of suitable low impedance matrix selection circuitry so that such heads may be used on a single head arm assembly. Similarly, the single turn heads have a comparatively low output which may be used advantageously with an amplifier circuit associated with the head arm assembly so that the output from the head arm assembly into the remainder of the apparatus will have a sufficiently high level amplitude so as to be uneffected by ambient electrical noise.

SUMMARY OF THE INVENTION

The present invention is shown in connection with low impedance heads associated with a center tap, step up, transformer, several of which are used in matrix connection circuitry. The circuit of the present invention may be deposited or fabricated as an integrated circuit on the actual head arm assembly or on a substrate which in turn is mounted on the head arm assembly of a magnetic disc drive. Naturally, the invention is not limited to this concept but can be fabricated and used with discrete components. However, the present state of the art naturally implies the use of integrated circuit techniques. The circuit consists of transistor pairs operating as differential amplifiers to form the selection means for the matrix arrangement. Output from the selected differential amplifier drives a common collector amplifier which forms the desired circuit output. A common emitter feedback amplifier provides current for the common base selection transistors. This type of feebback provides for common mode rejection of spurious signals and provides an amplifier having a very low input impedance. Head select signals are provided to the center tap of the transformer to drive the selection function. Write input signals are supplied through a pair of diodes associated with each head.

In the figures:

FIG. 1 is a circuit schematic diagram of a circuit according to the present invention.

DESCRIPTION OF THE PREFERRED EMBODIMENT

Figure 2:
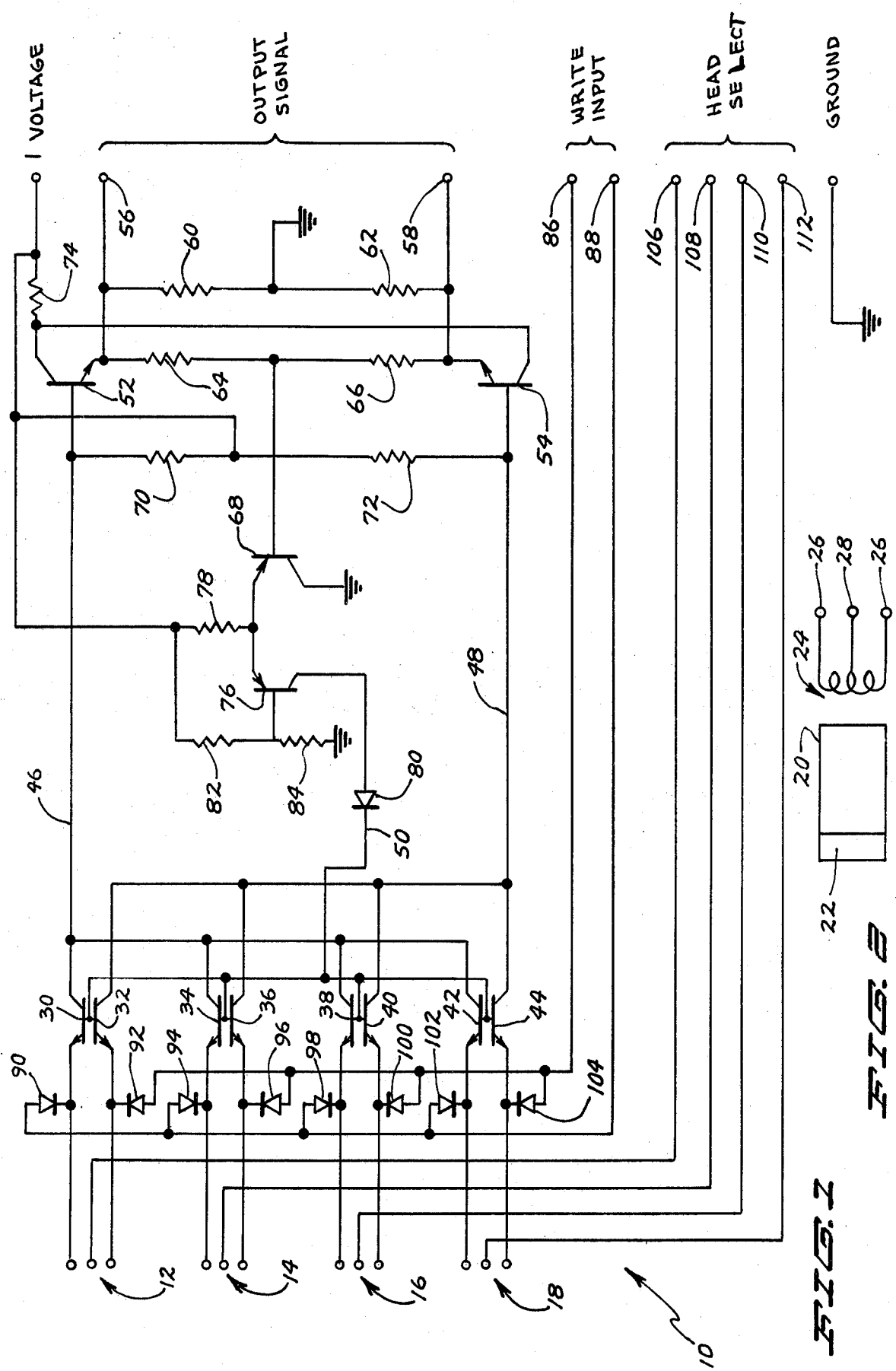
FIG. 2 is a schematic showing of one head configuration which can be connected to the circuit according to the present invention shown in FIG. 1.

Referring now to FIG. 1, an example of an embodiment 10 of the present invention suitable for use with four source devices is shown. The source devices contemplated for this embodiment are comprised of three terminal devices and therefore four sets of terminals 12, 14, 16, and 18 are shown, each having three terminals and adapted for connection to a source devices. FIG. 2 shows a suitable source device which may consist of a single turn of conductive material 20 which may be deposited or wound from discrete wire to form a magnetic head in association with a suitable magnetic core element 22. A transformer is formed in association with conductive element 20 which for example may be a 4:1 transformer 24 having an output consisting of two terminals 26 and a center tap 28.

Referring again to FIG. 1, associated with each set of terminals 12, 14, 16 and 18 is a pair of common base connected transistors, transistors 30 and 32 associated with terminals 12, transistors 34 and 36 associated with terminals 14, transistors 38 and 40 associated with terminals 16 and transistors 42 and 44 associated with terminals 18. These transistor pairs form common base amplifiers and their characteristics should preferably be matched for best amplification and common mode rejection. These transistors, may be monolithic devices, for example. Each of transistors 30–44 has its emitter connected to one of the associated terminals. The collectors of transistors 30, 34, 38 and 42 are connected to a common collector bus 46 while the collectors of transistors 32, 36, 40 and 44 are connected to a common collector bus 48. As previously stated, the bases of transistors 30 and 32, 34 and 36, 38 and 40, and 42 and 44 are connected together respectively. The bases of the just mentioned transistors pairs are all connected to a common conductor 50. Collector bus 46 is connected with the base of transistor 52 and the collector bus 48 is connected with the base of transistor 54.

Transistors 52 and 54 are connected in a common collector configuration in which the output signal is derived across terminals 56 and 58 connected to the emitters thereof. The emitter of transistor 52 is connected through resistor 60 to ground and the emitter of transistor 54 is connected through resistor 62 to ground. Also, resistors 64 and 66 form a voltage divider between the emitters of transistors 52 and 54 the center of which is connected to the base of transistor 68 in the feedback circuit. Bias current for the bases of transistors 52 and 54 is provided through resistors 70 and 72 respectively. The collectors of transistors 52 and 54 are connected together and receive their input voltage through resistor 74.

Transistor 76 is connected in common emitter configuration with transistor 68. Transistors 68 and 76 receive their current supply through resistor 78. The collector of transistor 68 is grounded while the collector of transistor 76 is connected through diode 80 to the common base conductor 50, previously described. Resistors 82 and 84 form a bias network for transistor 76.

Transistors 68 and 76 operate as a current feedback network to supply the base current for transistors 30–44. This form of feedback network allows a low impedance input characteristic for the source devices. When the circuit is used to write data on a magnetic disc the write input signals are provided to terminals 86 and 88 which are connected through diodes 90, 92, 94, 96, 98, 100, 102, and 104 to the terminals of terminations 12, 14, 16 and 18, respectively. Head select signals are provided to terminals 106, 108, 110 and 112 which are in turn connected to the center taps of terminations 12, 14, 16 and 18, respectively which in this embodiment of the invention is connected to center tap 28 of transformer 24. This invention can be configured with two terminal source devices where the head select termination is connected to one of the two terminals.

In operation, when the device is being used in the write mode, write input signals are provided to terminals 86 and 88 and connected to the selected head by operation of an associated pair of diodes, 90 and 92, through grounding of an appropriate head select terminal, 106 for example. During the write operation, the remaining head select inputs are held at a predetermined voltage, two to three volts for example. This voltage is not critical as an operating voltage, but must be sufficient to back bias associated diodes and transistors to cut off, without breaking down the junction being cut off.

During the read operation, the write input terminals and all of the associated diodes are inactive. The appropriate head select termination is grounded in order to activate the desired source device. The remaining head select terminations are held at a predetermined voltage, two to three volts, for example, in order to inactivate the unselected heads. Just as with the write operation the exact voltage is not critical. If termination 12 is selected for the desired source input by grounding of head select termination 106 for example, transistors 30 and 32 receive the input signals through their emitters, and as previously described, the collectors are connected to the bases of transistors 52 and 54 respectively. Output of the common collector amplifier comprised of transistors 52 and 54 appears at terminations 56 and 58 connected to the emitters of transistors 52 and 54 respectively. Transistors 30 and 32 receive base current through base current conductor 50, diode 80 and the collector of transistor 76 which operates as a feedback current source. The common emitter amplifier comprised of transistors 68 and 76 acts as a feedback amplifier and receives its input through the base of transistor 68 which is connected to the center of the voltage divider network comprised of resistors 64 and 66 connected between the emitters of transistors 52 and 54.

The feedback circuit comprised of the common emitter amplifier formed from transistors 68 and 76 provides excellent common mode rejection of spurious noise signals to give the output signal at terminals 56 and 58 a very good signal to noise ratio. Transistors 68 and 76 are selected to have similar characteristics and may, for example, be monolithic. Common mode signals appearing equally at the emitters of transistors 52 and 54 effect the emitter voltages equally and consequently affect the base voltage of transistor 68 causing negative feedback to inhibit the undesired signal. Bipolar signals of the type desired and appearing at the bases of transistors 52 and 54 affect the emitter voltages thereof unequally and oppositely tending to cancel out any effect of changing the base voltage of transistor 68. Thus, there is no feedback of bipolar signals which are thereby allowed to be amplified.

Using emitter input common base transistors of the type described, a circuit input impedance of as low as 5 ohms can be created. It is known in the art to design transistor circuits using parallel connected transistors to reduce input impedance, and therefore, using the principles of the invention hereinbefore described, one may connect multiple transistors in parallel in the same circuit configuration as shown to create lower input impedances, such as 1 ohm. If desired, the input impedance may have a range upwardly therefrom to approximately 50 ohms. Source devices of the type described may have an impedance on the order of one ohm and a signal level of approximately 100 microvolts.

In the present example of an embodiment of the invention, transistors 68 and 76 may be of type 2N4258 while the other transistors may be of type 2N3646. Resistors 60, 62, 64 and 66 may be 1000 ohms. The voltage supply may be 5 volts and resistor 74 may be 100 ohms. Resistors 78, 82 and 84 may be 4300, 3400 and 1700 ohms respectively.

What is claimed is:

1. A matrix amplifier circuit adapted to be associated with a plurality of source devices and for receiving and amplifying the signals from only a selected source device comprising:

a plurality of terminations for source devices, each termination comprising at least a first and second electrical connecting point, a plurality of common base input transistor amplifiers, each amplifier consisting of at least a first and second transistor having the bases thereof connected together, said amplifiers being connected to said terminations by having the emitter of said first transistor connected to said first connection point and the emitter of said second transistor connected to said second connection point, a common collector transistor amplifier having the base of one of its input transistors connected in common with all of the collectors of one of the transistors of each of said pairs of common base transistor amplifiers and the base of its other input transistor connected in common with all of the collectors of the other transistor of said pairs of common base transistor amplifiers, means for selecting an input transistor amplifier associated with a selected source device including means for biasing unselected transistors to a cutoff condition, and means for providing common mode rejection feedback signals to the bases of said common base input transistor amplifiers, said means being connected with said common collector transistor amplifier and to a common connection with the bases of all transistors in all input transistor amplifiers and further providing a source of base current for all of said common base transistor amplifiers.

2. The apparatus of claim 1 wherein said means for providing feedback comprises a pair of transistors operating as a common emitter feedback amplifier wherein the output is derived from the collector of one of the transistors having coupling means to said bases of all of said input transistor amplifiers and the input is to the base of the other of said transistors.

3. The apparatus of claim 2 wherein the input to the feedback amplifier is derived from a connection to a voltage divider network connected between the emitters of the transistors comprising said common collector amplifier.

* * * * *